United States Patent
Rietzler et al.

(10) Patent No.: US 9,224,086 B2
(45) Date of Patent: Dec. 29, 2015

(54) METHOD FOR CONTACTING A CHIP

(75) Inventors: Manfred Rietzler, Marktoberdorf (DE); Ulrich Lang, Bangkok (TH)

(73) Assignee: SMARTRAC IP B.V., Amsterdam (NL)

( * ) Notice: Subject to any disclaimer, the term of this patent is extended or adjusted under 35 U.S.C. 154(b) by 346 days.

(21) Appl. No.: 13/512,445

(22) PCT Filed: Sep. 27, 2010

(86) PCT No.: PCT/EP2010/005882
§ 371 (c)(1),
(2), (4) Date: May 29, 2012

(87) PCT Pub. No.: WO2011/063872
PCT Pub. Date: Jun. 3, 2011

(65) Prior Publication Data
US 2012/0234579 A1    Sep. 20, 2012

(30) Foreign Application Priority Data

Nov. 30, 2009    (DE) .................. 10 2009 056 122

(51) Int. Cl.
*H01P 11/00*    (2006.01)
*G06K 19/077*   (2006.01)
*H01L 23/00*    (2006.01)
*H01L 21/48*    (2006.01)

(52) U.S. Cl.
CPC ...... *G06K 19/07749* (2013.01); *G06K 19/0775* (2013.01); *H01L 24/80* (2013.01);
(Continued)

(58) Field of Classification Search
CPC .......................... H01Q 9/0421; H01Q 9/0414
USPC ........... 29/832–834, 840–842, 846–847, 825, 29/592.1, 600–601; 156/252–253, 268; 228/102–105, 120, 160, 170; 438/111–113
See application file for complete search history.

(56) References Cited

U.S. PATENT DOCUMENTS 5,566,441 A * 10/1996 Marsh et al. ............... 29/600
6,535,175 B2 * 3/2003 Brady et al. ............... 343/795
(Continued)

FOREIGN PATENT DOCUMENTS

DE    11 2007 001 365      5/2009
WO        2006/002335      1/2006
(Continued)

OTHER PUBLICATIONS

English Translation of the PCT International Preliminary Report on Patentability, PCT/EP2010/005882, Jun. 14, 2012.
(Continued)

*Primary Examiner* — Minh Trinh
(74) *Attorney, Agent, or Firm* — Quarles & Brady LLP

(57) ABSTRACT

The invention relates to a method for contacting a chip with a conductor arrangement and also to a conductor arrangement, particularly a transponder antenna, an intermediate carrier or the like, with a carrier substrate (55) for accommodating the chip and with a chip having chip terminal faces formed thereon, wherein a conductor material layer (66) is formed on the carrier substrate, wherein the conductor material layer forms a conductor arrangement (64) having at least two conductors (56, 57) which are connected to each other in a chip contact area (58), wherein an insulating gap (59) is formed in the chip contact area, such that mutually electrically insulated conductor terminal faces (60, 61) of the conductors are formed, wherein the chip terminal faces are contacted with the conductor terminal faces, and wherein the insulating gap is formed by removal of the conductor material layer by means of a laser.

18 Claims, 6 Drawing Sheets

(52) U.S. Cl.
CPC ............... *H01L 24/81* (2013.01); *H01L 24/83* (2013.01); *H01L 21/4814* (2013.01); *H01L 2224/2919* (2013.01); *H01L 2224/29099* (2013.01); *H01L 2224/83127* (2013.01); *H01L 2224/83192* (2013.01); *H01L 2224/83207* (2013.01); *H01L 2224/83385* (2013.01); *H01L 2924/01005* (2013.01); *H01L 2924/01006* (2013.01); *H01L 2924/01013* (2013.01); *H01L 2924/01019* (2013.01); *H01L 2924/01029* (2013.01); *H01L 2924/01033* (2013.01)

(56) References Cited

U.S. PATENT DOCUMENTS

| | | | |
|---|---|---|---|
| 6,666,380 B1 * | 12/2003 | Suzuya | 235/492 |
| 6,891,110 B1 | 5/2005 | Pennaz et al. | |
| 7,105,915 B1 * | 9/2006 | Finn et al. | 257/666 |
| 7,176,053 B1 * | 2/2007 | Dimmler | 438/99 |
| 7,709,294 B2 * | 5/2010 | Clare et al. | 438/111 |
| 2002/0003496 A1 | 1/2002 | Brady et al. | |
| 2005/0284917 A1 * | 12/2005 | Clare et al. | 228/170 |
| 2006/0243812 A1 * | 11/2006 | Puschner et al. | 235/492 |
| 2008/0224874 A1 | 9/2008 | Rodgers | |
| 2012/0234579 A1 * | 9/2012 | Rietzler et al. | 174/250 |

FOREIGN PATENT DOCUMENTS

| | | |
|---|---|---|
| WO | 2007/079277 | 7/2007 |
| WO | 2007/148836 | 12/2007 |

OTHER PUBLICATIONS

The International Search Report as mailed on Jan. 24, 2011 for International Application No. PCT/EP2010/005882.

\* cited by examiner

State of the art

State of the art

METHOD FOR CONTACTING A CHIP

CROSS-REFERENCE TO RELATED APPLICATIONS

This application represents the national stage entry of PCT International Application No. PCT/EP2010/005882 filed on Sep. 27, 2010 and claims the benefit of German Patent Application No. DE 10 2009 056 122.6 filed Nov. 30, 2009. The contents of both of these applications are hereby incorporated by reference as if set forth in their entirety herein.

STATEMENT REGARDING FEDERALLY SPONSORED RESEARCH

None.

BACKGROUND

The present invention relates to a method for contacting a chip with a conductor arrangement and also to a conductor arrangement, in particular a transponder antenna, an intermediate carrier or the like, with a carrier substrate for accommodating the chip and with a chip having chip terminal faces formed thereon, wherein a conductor material layer is formed on the carrier substrate, wherein the conductor material layer forms a conductor arrangement having at least two conductors which are connected to each other in a chip contact area, wherein an insulating gap is formed in the chip contact area such that mutually electrically insulated conductor terminal faces of the conductor are formed, and wherein the chip terminal faces are contacted with the conductor terminal faces.

Such methods for contacting a chip are regularly employed in the field of RFID technology, for instance in the production of transponder labels. A carrier substrate for the production of the transponder labels is made of a plastic material in the type of a thin film and serves in particular for accommodating a transponder antenna. The transponder antenna can basically be formed on the carrier substrate using the etching, imprinting or wire embedding technology. In the case of an antenna produced with the aid of an etching process, a chip having chip terminal faces formed thereon is directly placed on conductor terminal faces of the antenna and is connected, respectively contacted, with the same in an electrically conducting manner. Alternatively, the chip can be contacted with an intermediate carrier which is equally composed of a carrier substrate having conductor terminal faces and which has comparatively large antenna conductor terminal faces which in turn can be contacted with antenna conductors being produced for instance using the wire embedding technology. Thus, the intermediate carrier having the chip corresponds to a chip module which can be placed and contacted particularly easily due to the large antenna conductor terminal faces.

A problem encountered in the direct contacting of the chip with conductor terminal faces is to ensure accurate positioning of the chip. The conductor terminal faces are separated from each other by means of an insulating gap produced by an etching process, wherein during the positioning the chip straddles the insulating gap and with its corresponding chip terminal faces completely abuts against the conductor terminal faces. Depending on the material of the conductor material layer, the width of the insulating gap cannot be infinitely miniaturized using the known etching methods, in particular due to the aspect that the etching process results in an indefinite, respectively irregular, contour of the conductor terminal faces. Thus the chip needs to be positioned relatively accurately with its chip terminal faces on the conductor terminal faces, if the chip terminal faces are to be prevented from resting against the irregular peripheral region of the conductor terminal faces. In fact, it would also be possible to produce conductor terminal faces with a relatively regular contour if for instance copper were used for producing the conductor material layer. However, copper is relatively expensive compared to other materials and thus is unsuitable for mass production of conductor arrangements, as is required for instance in the case of labels.

The chips currently used for RFID labels regularly feature an edge length of approx. 600 μm, so that sufficiently accurate positioning of the chip on the conductor terminal faces being spaced apart by the insulating gap is still possible within acceptable tolerances. Hence, for instance a relative position of the chip transverse to the insulating gap can vary by approx. 80 μm. As a result of the technical progress, it will soon be possible to produce chips with an edge length of up to 300 μm. Even in the case where the width of the insulating gap and of the chip terminal faces is reduced, said chips require a much more accurate positioning with a positioning tolerance of for instance approx. 15 μm. Said small positioning tolerance is determined by the width of the insulating gap, which cannot be arbitrarily miniaturized in the known etching process.

SUMMARY

Thus it is an object of the present invention to suggest a method for contacting a chip with a conductor arrangement as well as a conductor arrangement, which require a reduced positioning accuracy for a chip on conductor terminal faces.

In the inventive method for contacting a chip with a conductor arrangement, particularly a transponder antenna, an intermediate carrier or the like, with a carrier substrate for accommodating the chip and with a chip having chip terminal faces formed thereon, a conductor material layer is formed on the carrier substrate, wherein the conductor material layer forms a conductor arrangement having at least two conductors which are connected to each other in a chip contact area, wherein an insulating gap is formed in the chip contact area such that mutually electrically insulated conductor terminal faces of the conductors are formed, wherein the chip terminal faces are contacted with the conductor terminal faces, and wherein the insulating gap is formed by removal of the conductor material layer by means of a laser.

Hence, a conductor material layer is formed on the carrier substrate, a chip having at least two terminal faces is placed on said conductor material layer and is contacted in another process, wherein the insulating gap above which the chip is placed is formed and structured by means of a laser. The inventive method thus makes it possible to form an insulating gap having a definite and regular contour, such that a width of the insulating gap, which is required for manufacture, can be significantly reduced compared to an insulating gap produced in an etching process. As a result, the positioning tolerance for a chip is enlarged, whereby the requirements with respect to the positioning accuracy of the chip are reduced. Due to the reduction of the required positioning accuracy inter alia the costs for assembly of the chip can be reduced. The conductor material layer, respectively the two conductors, is still produced in a conventional etching process if necessary. The two conductors are connected to each other only in the chip contact area, i.e. in the area which is covered by the chip subsequent to positioning. In the subsequent new method step, the insulating gap is formed in the chip contact area by complete removal of the conductor material layer up to a surface of the carrier substrate by means of the laser. Since the laser can be focused onto the conductor material layer, the removal is performed without significantly damaging or manipulating the carrier substrate. The insulating gap can be designed in a neat and accurate manner by means of the laser independently of the thickness of the conductor material layer, wherein, by contrast, the etching process causes an undesirable so-called back-etching of the contour, in particular in the case of greater layer thicknesses.

In another method step provision can be made for the chip contact area being cleaned with the aid of a plasma treatment, in particular for removing the aluminum oxide in case of using aluminum as the conductor material. By means of a plasma treatment, such as cathode evaporation, i.e. the so-called sputtering, swarf or residues resulting from the laser treatment can be removed. Advantageously, an ultra-pure surface of the conductor terminal faces can thus be obtained.

In another method step an adhesive material can be applied onto the chip contact area prior to or subsequent to contacting of the chip. The adhesive material can serve as a so-called underfiller adhesive for mechanical fastening of the chip on the carrier substrate. The adhesive material can be directly applied onto the chip contact area or into a space between the chip and the carrier substrate with the aid of a dosage device and can subsequently be cured. Conductive, non-conductive or anisotropic adhesive, respectively liquid or pasty adhesive, can be employed as the adhesive material.

It is particularly advantageous if a relative position of the insulating gap is determined with the aid of an image processing device prior to placement of the chip. Thus, accurate positioning of the chip relative to the insulating gap, as is required in the case of chips having particularly small edge lengths, is easily possible.

Alternatively, a relative position of outer areas of the chip contact area can be determined with the aid an image processing device prior to placement of the chip, in particular an outer contour of the conductor terminal faces having the insulating gap which is visible in the outer contour. Hence, the position of the insulating gap can be determined even in the case where adhesive material or other elements covering the insulating gap have already been applied beforehand in the chip contact area.

Hence, the relative position of outer areas of the chip contact area can be determined prior to or subsequent to the application of adhesive material onto the chip contact area. This is possible in view of the fact that the required chip position is always aligned with respect to the insulating gap.

It is possible to easily determine the required chip position if the chip position on the carrier substrate is calculated from data of the image processing device by means of a machine control system. Consequently, for instance a chip position can be easily corrected in the case of a positional deviation of the insulating gap. Subsequent to the correspondingly simplified and accurate positioning of the chip, the chip, respectively the chip terminal faces, can be contacted with the conductor terminal faces of the carrier substrate with the aid of pressure and temperature, respectively by exposure to ultrasound and temperature.

In order to avoid height differences of the carrier substrate relative to the laser, which would adversely affect the laser treatment, for instance in the form of corrugations created in the carrier substrate, the carrier substrate can be fixed on a plate with the aid of a liquid film in order to form the insulating gap. For instance, a water film can be provided between a flat plate and a film-like carrier substrate, said water film forming an adhesion layer. The carrier substrate thus rests flatly on the plate such that the focal point of the laser can always be positioned in the region of the conductor material layer.

The carrier substrate can also be fixed on a plate with the aid of underpressure in order to form the insulating gap. For this purpose, the plate can be furnished with a bore grid, wherein a vacuum is applied at the bores, respectively a suction of air is caused, which in turn causes suction of the carrier substrate onto the flat plate.

The conductor arrangement can be produced particularly inexpensively if the conductor material layer is made of aluminum. Aluminum can be obtained at a relatively low cost compared to other materials for the production of the conductor material layer. Alternatively, the conductor material layer can be made also of the comparatively more expensive copper or other suitable materials.

In another embodiment, the conductor arrangement can be designed as a transponder antenna. In that case the carrier substrate can serve as an antenna substrate, wherein the transponder antenna can be designed as a dipole or in the form of a flat coil. Hence, an antenna can be calibrated in the UHF range (dipole). Thus, there are two electrically separate antenna regions which are electrically connected to each other via the chip by means of the chip in the region of the insulating gap. By the same token, a high-frequency transponder antenna can be designed as a coil or a multiple loop. Thus, the conductor material layer is closed completely and is only electrically open in the region of the insulating gap.

Particularly advantageously, use of the laser also makes it possible to tune the frequency of the transponder antenna by removing the conductor material layer or by separating conductor segments. Thus, it is possible to form a correspondingly identical transponder antenna for different types of transponders or chips and to tune the frequency of the transponder antenna by shortening conductor strips. More appropriately, this can be performed in a single step together with the formation of the insulating gap. The frequency tuning can also be performed by completely separating regions of the transponder antenna from the actual antenna conductor by means of the laser. Thus, a parasitic capacitance is created which is not Ohm-electrically connected to the antenna but produces a capacitive effect via the small insulating gap and thus has a bearing on the resonance frequency of the transponder antenna.

The transponder antenna further can be designed with predefined separating areas, which can be separated by means of the laser. Said separating areas can be thinner or smaller in width than a regular conductor cross-section, so that they can be separated more easily.

In another embodiment, the conductor arrangement can be designed as an intermediate carrier. An outer contour of a conductor material layer of the intermediate carrier can equally be formed by a conventional etching process, wherein the conductor material layer in this case can equally be removed, respectively separated, by means of the laser to form at least two conductor terminal faces. Subsequently, the chip can be placed on the intermediate carrier, wherein the intermediate carrier together with the chip can be used as a chip module for connection with a transponder antenna.

Advantageously, the insulating gap can be designed with a gap width of $\leq 20$ µm. Thus, the insulating gap is particularly small compared to the insulating gaps produced in an etching process, so that the conductor arrangement is particularly well suited for accommodating chips with very small edge lengths.

It is also possible to produce at least four insulated conductor terminal faces in the chip contact area. This is advantageous if the chip has a corresponding number of chip terminal faces, such that the conductor terminal faces can serve as a support for the chip. It is likewise possible to design the conductor terminal faces so as to be neutral, i.e. without any further electrical conductor connection. It is basically possible to provide any arbitrary number of conductor terminal faces.

In order to mass-produce conductor arrangements it is advantageous if the carrier substrate is designed as a film strip having a plurality of conductor arrangements disposed in parallel rows and if it is moved relative to the laser so as to be moved past the same. The film strip, for instance, can be stored on a reel, wherein the formation of the insulating gap and the contacting of the chip can be performed either independently or else in directly consecutive process steps.

Advantageously, it is also possible to contact a chip intermediate carrier prior to the contacting of a chip. The use of a chip intermediate carrier makes it possible to form an insulating gap which is less accurate and smaller in width.

In the inventive conductor arrangement, in particular a transponder antenna, an intermediate carrier or the like, a conductor material layer is formed on a carrier substrate for the contacting of chip terminal areas of a chip, wherein the conductor material layer forms a conductor arrangement having at least two conductors, wherein an insulating gap is formed in a chip contact area such that mutually electrically insulated conductor terminal faces of the conductors are formed, wherein the chip terminal faces can be contacted with the conductor terminal faces, and wherein the insulating gap is formed by removal of the conductor material layer by means of a laser.

Further advantageous embodiments of a conductor arrangement are obvious from the descriptions of the features of the subclaims which are dependent on method claim 1.

BRIEF DESCRIPTION OF THE DRAWINGS

Hereinafter, the invention will be described in greater detail with reference to the attached drawings.

In the drawings.

DETAILED DESCRIPTION

Figure 1:
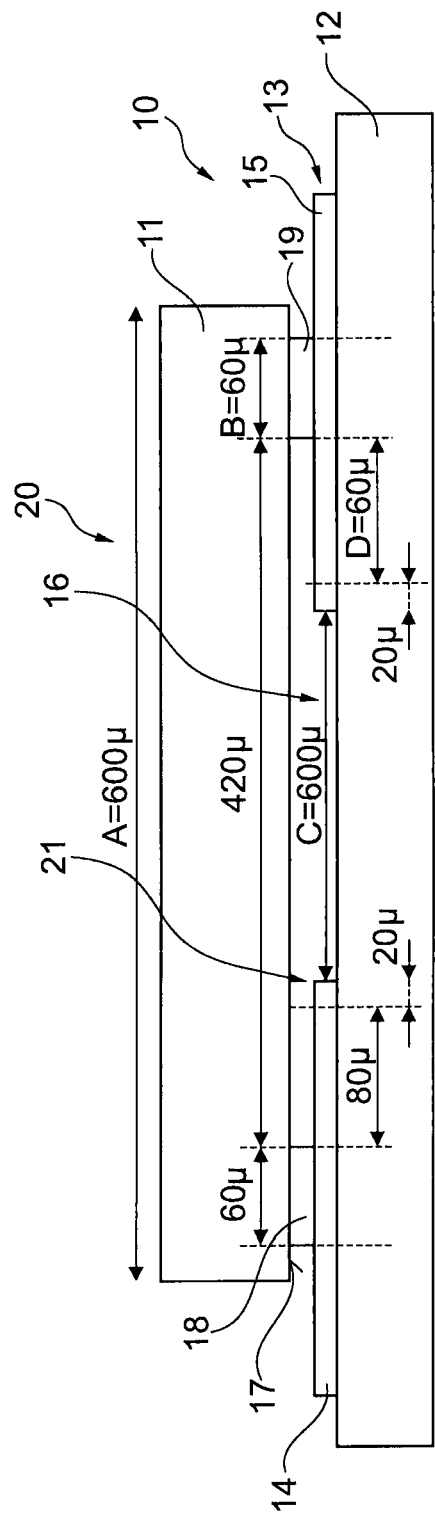
FIG. 1 shows a conductor arrangement according to the state of the art having a chip contacted thereon in a lateral view.
Figure 3:
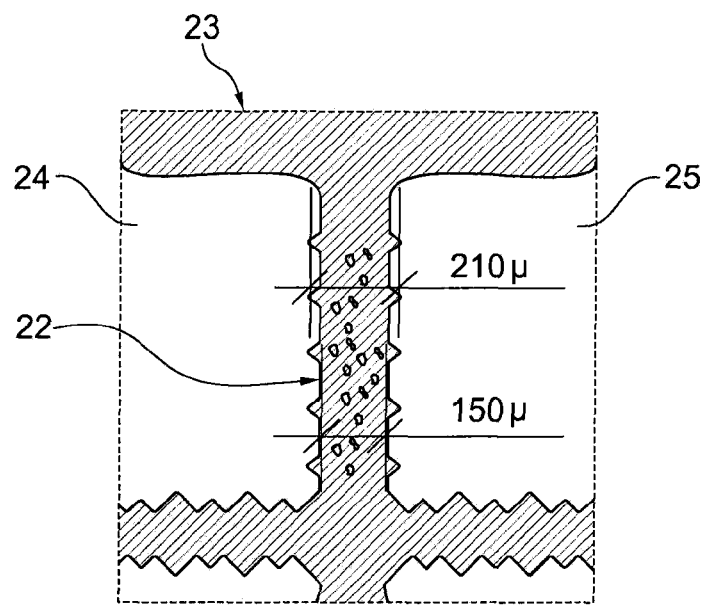
FIG. 3 shows conductor terminal faces according to the state of the art in a partial view.

FIG. 1 shows a conductor arrangement 10 according to the state of the art having a chip 11 contacted thereon. The conductor arrangement 10 comprises a carrier substrate 12 having a conductor material layer 13 forming conductor terminal faces 14 and 15. The conductor terminal faces 14 and 15 are electrically separated from each other by means of an insulating gap 16. Moreover, at the lower side 17 of the chip 11 provision is made for chip terminal faces 18 and 19 which are disposed on the conductor terminal faces 14 and 15 and are connected to the same in an electrically conductive manner. The chip 11 thereby straddles the insulating gap 16, wherein the conductor terminal faces 14 and 15 form a possible chip contact area 20, wherein the chip 11 can be contacted with the conductor terminal faces 14 and 15. A contacting of the conductor terminal faces 14 and 15 in a peripheral region 21 is undesirable, since as a result of the production of the insulating gap 16 in an etching process, the peripheral region 21 is designed with an indefinite, respectively irregular contour 22, as is exemplarily shown for instance in FIG. 3. An insulating gap 23 shown in this figure varies in its width between 150 and 210 μm between the conductor terminal faces 24 and 25 made of aluminum.

Figure 2:
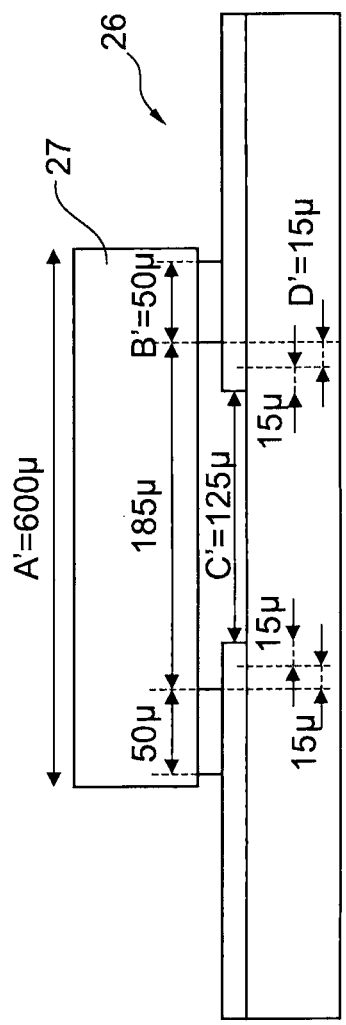
FIG. 2 shows another embodiment of a conductor arrangement having a chip contacted thereon in a lateral view.

FIG. 2 shows a possible adaptation of a conductor arrangement 26 to a chip 27 having an edge length A' being reduced with respect to the chip 11. The conductor arrangement 26 and the chip 27 basically have the same structure according to the conductor arrangement 10, respectively the chip 11 shown in FIG. 1. In addition to the edge length A', in contrast to the conductor arrangement 10 and to the chip 11, here a chip terminal face width B' and an insulating gap width C' are reduced in their constructional size. A further reduction of the insulating gap width C' is not possible due to the indefinite contour 22 shown in FIG. 3, as can be created in an etching process. Thus, the chip 27 can be contacted with the conductor arrangement 26 only within a relatively small positioning tolerance D'.

Figure 4:
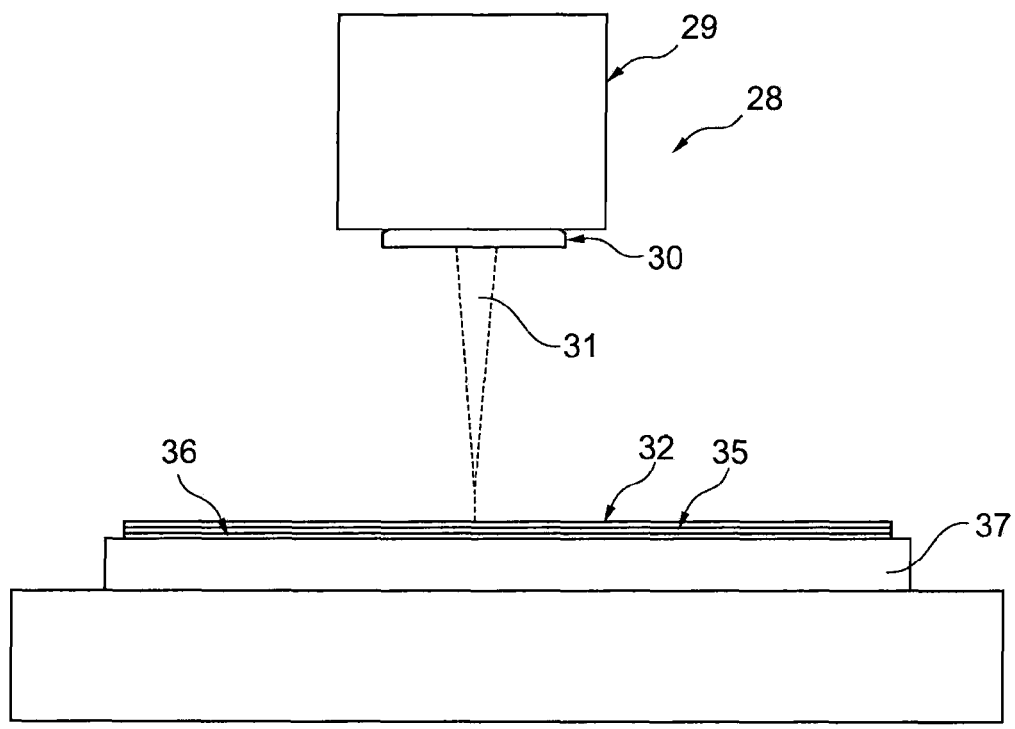
FIG. 4 shows a lateral view of a laser device in a schematic view.

FIG. 4 shows an exemplary laser device 28 for producing an inventive conductor arrangement (not shown here in greater detail). The laser device 28 is composed of a laser 29 having a scanner system (not shown here). The laser 29 is equipped with lenses 30 being capable of focussing a laser beam 31 onto a conductor material layer 32 made of aluminum. The conductor material layer 32, according to the view shown in FIG. 5, forms a plurality of conductor arrangements 33 which each in turn form a transponder antenna 34. The conductor arrangements 33 are disposed on a carrier substrate 35, wherein the carrier substrate 35, as can be seen in FIG. 4, is fixed on a glass plate 37 with the aid of a liquid film 36, in particular by the adhesive force of the liquid film.

Figure 5:
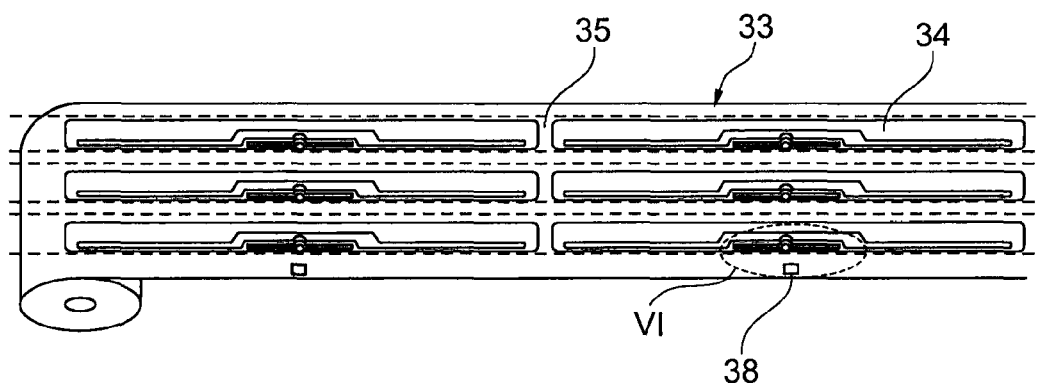
FIG. 5 shows a plurality of conductor arrangements on a carrier substrate.
Figure 6:
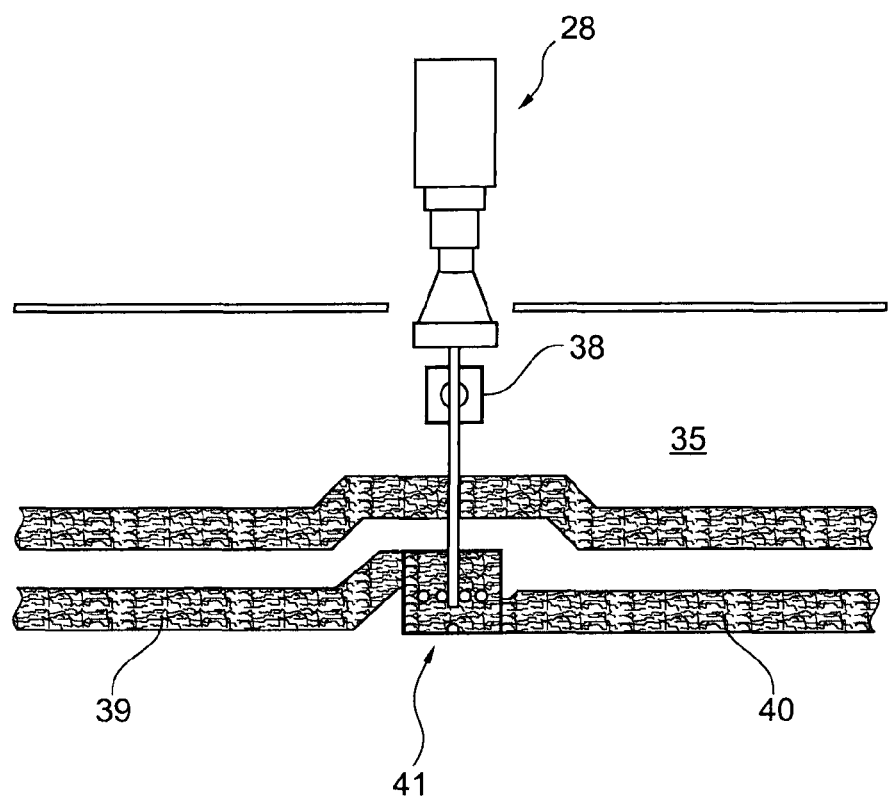
FIG. 6 shows a first method step in a schematic view.
Figure 7:
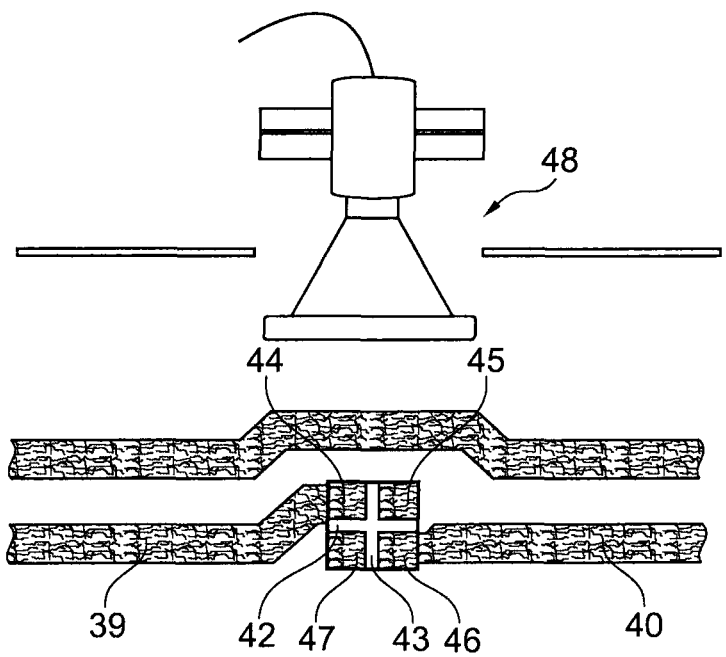
FIG. 7 shows a second method step in a schematic view.

FIG. 6 shows a first step of the method with a section VI of a transponder antenna 34 of FIG. 5. The carrier substrate 35 is aligned with the aid of a positioning marker 38, and the transponder antenna 34 is aligned relative to the laser 29. A first conductor 39 and a second conductor 40 of the transponder antenna 34 are formed on the carrier substrate 35. Both conductors 39 and 40 are connected to each other in a chip contact area 41, wherein conductor material is subsequently removed by means of the laser beam 31, resulting in the formation of insulating gaps 42 and 43 which, as shown in FIG. 7, form conductor terminal faces 44 and 47. Here, the conductor terminal face 44 is electrically connected to the first conductor 39, and the conductor terminal face 46 is electrically connected to the second conductor 40. The conductor terminal faces 45 and 47, by contrast, are not electrically contacted and only serve for supporting the chip to be contacted. Subsequent to the production of the insulating gaps 42 and 43, the chip contact area 41 is cleaned with the aid of a plasma treatment. By means of a corresponding device 48 inter alia possible residues resulting from the laser treatment are removed.

Figure 8:
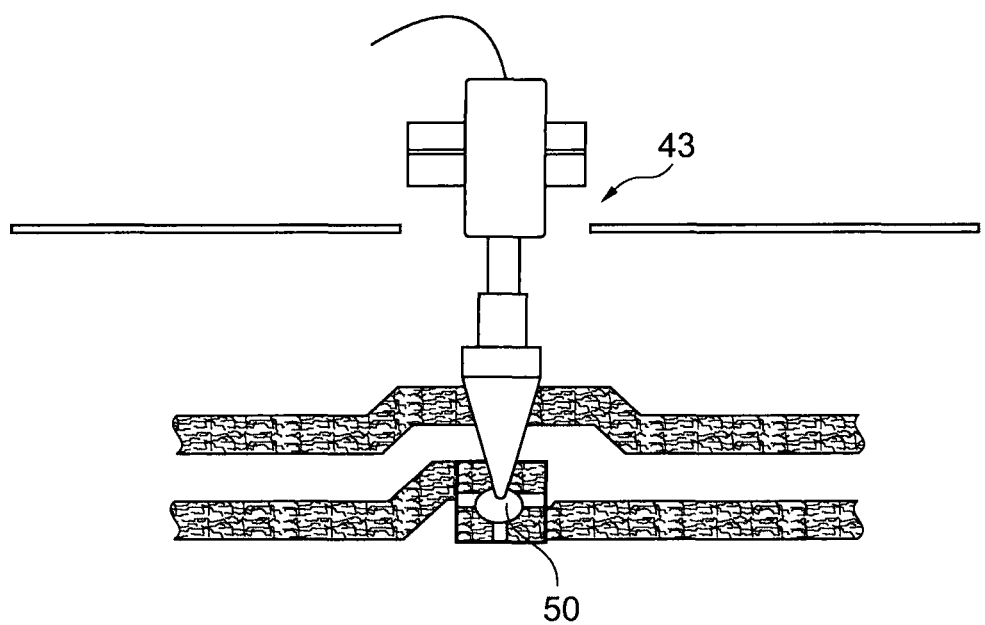
FIG. 8 shows a third method step in a schematic view.

Subsequently, as shown in FIG. 8, an adhesive material 50 is applied onto the chip contact area 41 using a dosage device 49.

Figure 9:
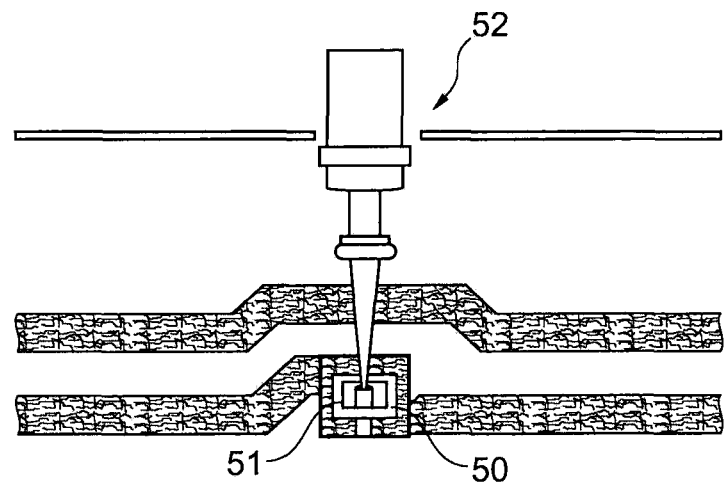
FIG. 9 shows a fourth method step in a schematic view.
Figure 10:
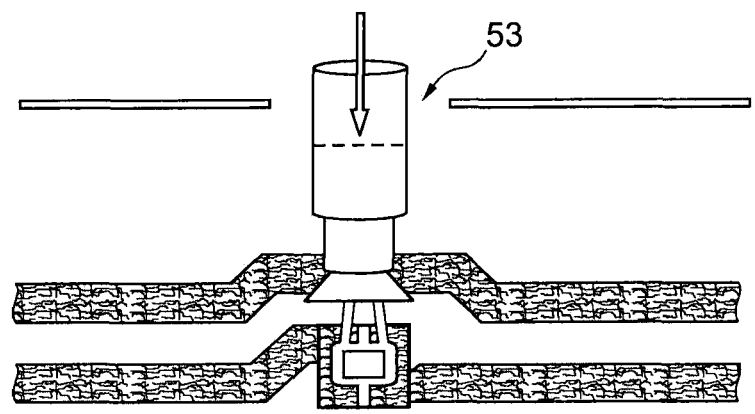
FIG. 10 shows a fifth method step in a schematic view.

Subsequently a chip 51 is placed on the conductor terminal faces 44 to 47, wherein a position of the insulating gaps 42 and 43 is determined with the aid of an image processing device (not shown here), and an accurate contact position for the chip 51 is calculated. A positioning device 52 corrects the corresponding positional deviations. Subsequent to the placement of the chip 51 shown in FIG. 9, the chip 51 having chip terminal faces (not shown here) is contacted with the conductor terminal faces 44 to 47 as shown in FIG. 10. The contacting is performed automatically by means of a device 53, respectively by means of the so-called thermosonic method using ultrasound and temperature.

Figure 11:
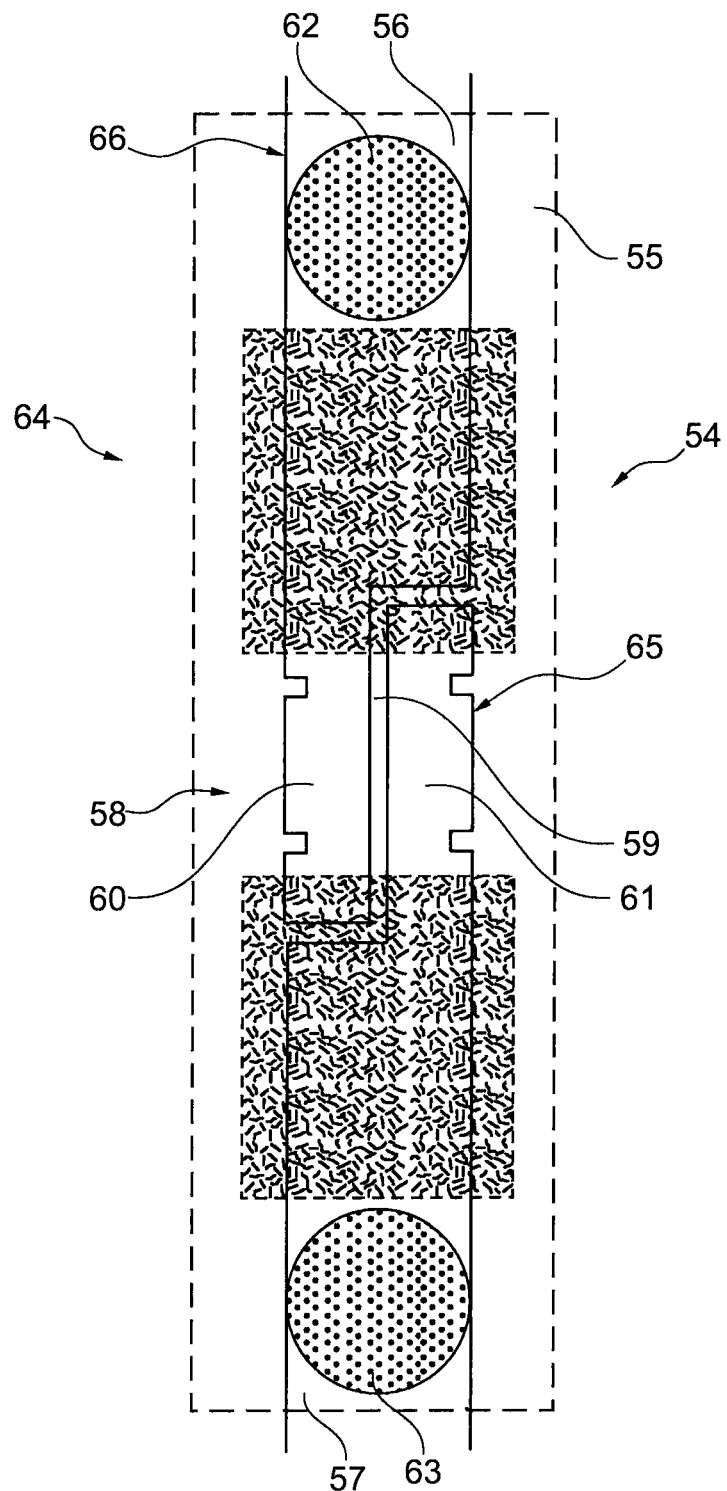
FIG. 11 shows an intermediate carrier with an embodiment of a conductor arrangement.

FIG. 11 shows an intermediate carrier 54, respectively a so-called strap, on which a chip (not shown here) can be contacted with chip terminal faces. The intermediate carrier 54 comprises a carrier substrate 55 having a first conductor 56 and a second conductor 57, wherein both conductors 56 and 57 are separated from each other in a chip contact area 58 by means of an insulating gap 59 and thus form conductor terminal faces 60 and 61. The conductors 56 and 57 further have antenna terminal faces 62 and 63 which can serve for contacting with a transponder antenna (not shown here). A conductor arrangement 64 designed in this manner was firstly produced in a conventional etching process with an outer contour 65 on the carrier substrate 55, wherein the insulating gap 59 was subsequently produced by a slit-like removal of a conductor material layer 66 by means of a laser (not shown here).

The invention claimed is:

1. A method for contacting a chip with a conductor arrangement, said conductor arrangement including a carrier substrate for accommodating the chip having chip terminal faces formed thereon, said method comprising:
    forming a conductor material layer on the carrier substrate, wherein the conductor material layer forms a conductor arrangement having at least two conductors which are connected to each other in a chip contact area;
    forming an insulating gap in the chip contact area by removing at least a portion of the conductor material layer in the chip contact area using a laser, such that mutually electrically insulated conductor terminal faces of the conductors are formed;
    determining a relative position of the insulating gap with the aid of an image processing device; and
    based on the relative position of the insulating gap contacting the chip terminal faces with the conductor terminal faces.

2. The method according to claim 1, further comprising the step of cleaning the chip contact area with the aid of a plasma treatment.

3. The method according to claim 1, further comprising the step of applying an adhesive material onto the chip contact area prior to or subsequent to contacting the chip terminal faces with the conductor terminal faces.

4. The method according to claim 1, in which the step of determining a relative position of the insulating gap with the aid of an image processing device is performed prior to contacting the chip terminal faces with the conductor terminal faces.

5. The method according to claim 4, wherein the step of determining the relative position is performed prior to or subsequent to the application of an adhesive material onto the chip contact area.

6. The method according to claim 4, further comprising the step of calculating a chip position on the carrier substrate from data of the image processing device using a machine control system.

7. The method according to claim 1, further comprising the step of determining a relative position of outer areas of the chip contact area with the aid of an image processing device prior to contacting the chip terminal faces with the conductor terminal faces.

8. The method according to claim 1, further comprising the step of fixing the carrier substrate on a plate with the aid of a liquid film in order to form the insulating gap.

9. The method according to claim 1, further comprising the step of fixing the carrier substrate on a plate by a vacuum in order to form the insulating gap.

10. The method according to claim 1, in which the conductor material layer is made of aluminum.

11. The method according to claim 1, in which the conductor arrangement is a transponder antenna.

12. The method according to claim 11, further comprising the step of tuning the frequency of the transponder antenna by removing the conductor material layer or by separating conductor segments using the laser.

13. The method according to claim 12, in which the transponder antenna is designed with pre-defined separating areas which can be separated using the laser.

14. The method according to claim 1, in which the conductor arrangement is an intermediate carrier.

15. The method according to claim 1, in which the insulating gap has a gap width of ≤20 µm.

16. The method according to claim 1, in which four insulated conductor terminal faces are formed in the chip contact area.

17. The method according to claim 1, in which the carrier substrate is a film strip having a plurality of conductor arrangements disposed in parallel rows and is moved relative to the laser.

18. The method according to claim 1, further comprising the step of contacting a chip intermediate carrier prior to contacting the chip terminal faces with the conductor terminal faces.

* * * * *